United States Patent
Gurdiel Gonzalez et al.

(10) Patent No.: US 11,989,487 B2
(45) Date of Patent: May 21, 2024

(54) GEOMETRICAL COMPENSATION MODELS

(71) Applicant: HEWLETT-PACKARD DEVELOPMENT COMPANY, L.P., Spring, TX (US)

(72) Inventors: Enrique Gurdiel Gonzalez, Sant Cugat del Valles (ES); Jordi Sanroma Garrit, Sant Cugat del Valles (ES); Manuel Freire Garcia, Sant Cugat del Valles (ES)

(73) Assignee: Hewlett-Packard Development Company, L.P., Spring, TX (US)

(*) Notice: Subject to any disclaimer, the term of this patent is extended or adjusted under 35 U.S.C. 154(b) by 430 days.

(21) Appl. No.: 17/295,346

(22) PCT Filed: Apr. 30, 2019

(86) PCT No.: PCT/US2019/029863
§ 371 (c)(1),
(2) Date: May 19, 2021

(87) PCT Pub. No.: WO2020/222793
PCT Pub. Date: Nov. 5, 2020

(65) Prior Publication Data
US 2021/0390219 A1 Dec. 16, 2021

(51) Int. Cl.
*G06F 30/10* (2020.01)
*B29C 64/393* (2017.01)
*B33Y 50/00* (2015.01)

(52) U.S. Cl.
CPC ............ *G06F 30/10* (2020.01); *B29C 64/393* (2017.08); *B33Y 50/00* (2014.12)

(58) Field of Classification Search
CPC ........ B29C 64/393; B33Y 50/00; G06F 30/10
USPC .......................................................... 700/98
See application file for complete search history.

(56) References Cited

U.S. PATENT DOCUMENTS

| | | |
|---|---|---|
| 7,444,616 B2 | 10/2008 | Sandstrom |
| 7,907,774 B2 | 3/2011 | Parr |
| 9,950,476 B2 | 4/2018 | Nguyen |
| 2005/0105071 A1 | 5/2005 | Ishii |
| 2016/0086376 A1 | 3/2016 | Tang |
| 2016/0299996 A1 | 10/2016 | Huang |
| 2017/0368753 A1* | 12/2017 | Yang ............... G01B 21/20 |
| 2017/0372480 A1 | 12/2017 | Anand |
| 2018/0304540 A1 | 10/2018 | Tobia |
| 2018/0333965 A1 | 11/2018 | Reiniger |
| 2019/0004079 A1* | 1/2019 | Blom ............... B33Y 50/02 |
| 2021/0181714 A1* | 6/2021 | Gurdiel Gonzalez . B33Y 50/00 |

FOREIGN PATENT DOCUMENTS

EP 0921374 B1 4/2005

* cited by examiner

*Primary Examiner* — Chun Cao
(74) *Attorney, Agent, or Firm* — Michael Dryja

(57) ABSTRACT

In an example, a machine-readable medium stores instructions which, when executed by a processor may cause the processor to modify data for characterising geometrical modifications for use by each of a plurality of additive manufacturing apparatus, wherein a modification for a particular additive manufacturing apparatus is based on dimensions of objects generated by that apparatus.

19 Claims, 5 Drawing Sheets

GEOMETRICAL COMPENSATION MODELS

BACKGROUND

Additive manufacturing techniques may generate a three-dimensional object through the solidification of a build material, for example on a layer-by-layer basis. In examples of such techniques, build material may be supplied in a layer-wise manner and the solidification method may include heating the layers of build material to cause melting in selected regions. In other techniques, chemical solidification methods may be used.

BRIEF DESCRIPTION OF DRAWINGS

Non-limiting examples will now be described with reference to the accompanying drawings, in which.

DETAILED DESCRIPTION

Figure 1:
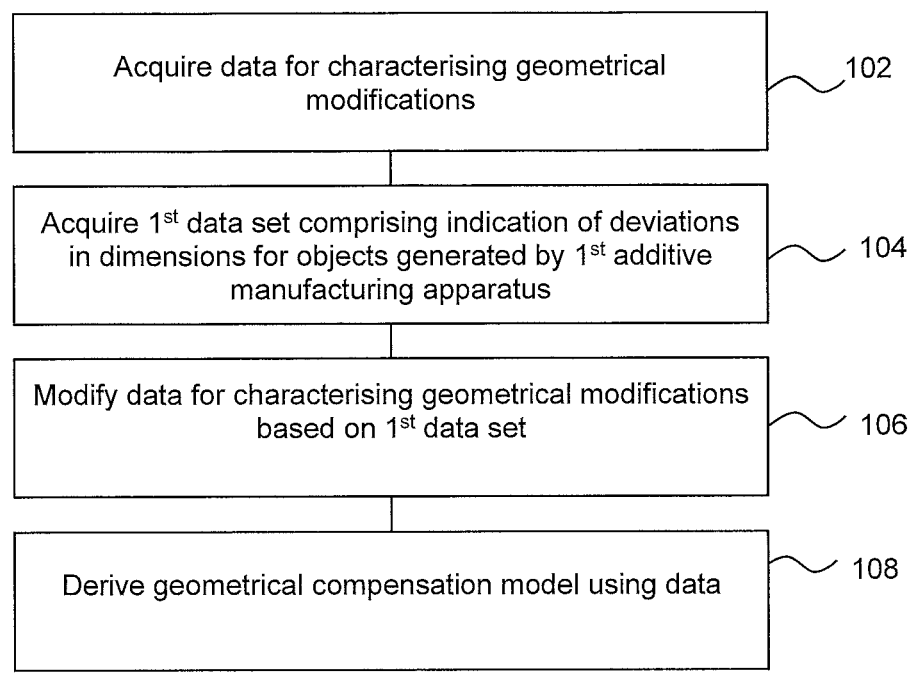
FIGS. 1 and 2 show example methods of deriving geometrical compensation models.

Additive manufacturing techniques may generate a three-dimensional object through the solidification of a build material. In some examples, the build material is a powder-like granular material, which may for example be a plastic, ceramic or metal powder and the properties of generated objects may depend on the type of build material and the type of solidification mechanism used. In some examples the powder may be formed from, or may include, short fibres that may, for example, have been cut into short lengths from long strands or threads of material. Build material may be deposited, for example on a print bed and processed layer by layer, for example within a fabrication chamber. According to one example, a suitable build material may be PA12 build material commercially referred to as V1R10A "HP PA12" available from HP Inc.

In some examples, selective solidification is achieved using heat, for example through directional application of energy, for example using a laser or electron beam which results in solidification of build material where the directional energy is applied. In other examples, at least one print agent may be selectively applied to the build material, and may be liquid when applied. For example, a fusing agent (also termed a 'coalescence agent' or 'coalescing agent') may be selectively distributed onto portions of a layer of build material in a pattern derived from data representing a slice of a three-dimensional object to be generated (which may for example be generated from structural design data). The fusing agent may have a composition which absorbs energy such that, when energy (for example, heat) is applied to the layer, the build material heats up, coalesces and solidifies upon cooling, to form a slice of the three-dimensional object in accordance with the pattern. In other examples, coalescence may be achieved in some other manner.

According to one example, a suitable fusing agent may be an ink-type formulation comprising carbon black, such as, for example, the fusing agent formulation commercially referred to as V1Q60A "HP fusing agent" available from HP Inc. In examples, such a fusing agent may comprise any or any combination of an infra-red light absorber, a near infra-red light absorber, a visible light absorber and a UV light absorber. Examples of print agents comprising visible light enhancers are dye based colored ink and pigment based colored ink, such as inks commercially referred to as CE039A and CE042A available from HP Inc.

In addition to a fusing agent, in some examples, a print agent may comprise a coalescence modifier agent, which acts to modify the effects of a fusing agent for example by reducing or increasing coalescence or to assist in producing a particular finish or appearance to an object, and such agents may therefore be termed detailing agents. In some examples, detailing agent may be used near edge surfaces of an object being printed, and may for example act to cool the build material to which it is applied, or otherwise to reduce or prevent coalescence thereof. According to one example, a suitable detailing agent may be a formulation commercially referred to as V1Q61A "HP detailing agent" available from HP Inc. A coloring agent, for example comprising a dye or colorant, may in some examples be used as a fusing agent or a coalescence modifier agent, and/or as a print agent to provide a particular color for the object.

As noted above, additive manufacturing systems may generate objects based on structural design data. This may involve a designer generating a three-dimensional model of an object to be generated, for example using a computer aided design (CAD) application. The model may define the solid portions of the object. To generate a three-dimensional object from the model using an additive manufacturing system, the model data can be processed to derive slices of parallel planes of the model. Each slice may define a portion of a respective layer of build material that is to be solidified or caused to coalesce by the additive manufacturing system.

FIG. 1 is an example of a method, which may comprise a computer implemented method of deriving a geometrical compensation model for use in additive manufacturing, wherein the model is derived for a particular object generation apparatus.

Geometrical transformations may be used to modify object model data, for example to apply a geometrical compensation in order to compensate for anticipated departures from intended dimensions when generating an object. The transformation to apply may be provided by use of a geometrical compensation model, which may specify at least one geometrical transformation parameter.

For example, it may be the case that, in some print apparatus, when an object is generated in a process which includes heat, additional build material may adhere to the object on generation. In one example, fusing agent may be associated with a region of the layer which is intended to fuse. However, when energy is supplied, build material of neighbouring regions may become heated and fuse to the outside of the object (in some examples, being fully or partially melted, or adhering to melted build material as powder). Therefore, a dimension of an object may be larger than the regions to which fusing agent is applied. In order to compensate for this effect, i.e. where it is anticipated that an object may tend to 'grow' during manufacture in this (or some other) manner, the object volume as described in object model data may be reduced to compensate for such growth. The reduction of the volume may be defined in a geometrical compensation (or geometrical transformation) model as at least one geometrical compensation parameter.

In other examples, objects may be smaller following object generation than is specified in object model data. For example, some build materials used to generate objects may shrink on cooling. Therefore, a geometrical compensation/ transformation model may specify at least one geometrical compensation parameter to in turn specify how an object volume in object model data should be increased to compensate for the anticipated reduction in volume.

A particular object may be subject to mechanisms which result in growth and/or shrinkage, and the actual compensation to be applied may be determined by consideration of, or may be influenced by, the different degrees to which an object may be affected by such processes.

In some examples, a modification may be specified using a geometrical compensation parameter(s) comprising scaling and/or offset parameter(s) (for example, a scaling factor and/or an offset value). A scaling factor may be used to multiply all specified dimensions in the direction of at least one axis by a value, which may be greater than 1 in order to increase the dimension(s) and less than 1 to reduce the dimension(s). An offset value may specify, for example by a specified distance or a number of defined sub volumes or 'voxels' (i.e. three-dimensional pixels), an amount to add or remove from a surface of the object (or a perimeter within a layer). For example, a distance as measured in the direction of a normal from the object surface may be specified and the object may be eroded or dilated (i.e., inflated or enlarged) by this distance.

Geometrical compensations may in general be determined based on a theoretical analysis of object generation, for example considering the predicted temperatures and/or material behaviour characteristics. In some examples, geometrical compensation models/parameters may for example be determined by trial and error over time and/or using machine learning techniques. For example, geometrical compensation models/parameters may be derived based on test objects, which may be generated (i.e. manufactured or 'printed') and measured to characterise the deformations. In some examples, geometrical compensation models/parameters may be derived using machine learning techniques based on deviations from expected dimensions in previously generated objects. For example, where previously generated objects have tended to be smaller than expected in a particular dimension, there may be a scaling factor of greater than 1 and/or a positive offset derived and where previously generated objects have tended to be larger than expected in a particular dimension, there may be a scaling factor of less than 1 and/or a negative offset derived.

One example of a geometrical compensation model may comprise one or a set of scaling and/or offset parameters associated with a particular object generation apparatus, or type of object generation apparatus. The parameters may be applied to all objects in the same way (for example, regardless of the object size and/or placement).

In other examples, a geometrical compensation model may allow a geometrical compensation derived or selected therefrom to be tailored to an intended object generation operation and/or object.

For example, a geometrical compensation model may take account of an intended location of an object in a fabrication chamber. It has been noted that dimensional deformation is related to the location of object generation when determining a compensation, and therefore different compensation parameters may be applied for different object locations to improve accuracy. Such geometrical compensation models may therefore comprise or provide compensation parameters which may be mapped to the intended location of an object (which may for example be a single identifiable point such as the location of the centre of mass of the object, or may include a consideration of the volumetric extent of the object).

For example, if an object is to be generated at a first location within the fabrication chamber, the location may be mapped to a geometrical compensation comprising one or more offset and/or scaling values. However, if the same object were to be generated at a second location within the fabrication chamber, this second location may be mapped to a different geometrical compensation comprising one or more different offset and/or scaling values. Thus, the particular geometrical compensation applied may vary between different locations based on predetermined mappings or the like.

In some examples, at least one geometrical compensation model may comprise a plurality of defined geometrical compensation parameters (or parameter sets), each associated with different locations within the fabrication chamber. In such examples, a particular geometrical compensation parameter(s) and/or value(s) may be selected based on the intended object generation location. In some examples, defined locations may be associated with geometrical compensation parameter(s)/value(s), and the geometrical compensation parameter(s)/value(s) to apply at locations intermediate to such defined locations may be derived for example by interpolation, or by selection of the closest defined location, or the like.

In other examples, characteristics of the object, such as consideration of the object volume and/or surface area, may be used as input parameters in a geometrical compensation model.

For example, bulkier objects (i.e. objects having a larger volume) may accrue greater thermal energy than smaller objects, and may therefore tend to accumulate more heat than smaller objects. Cooling such objects may therefore take more time than cooling less bulky objects. This may lead to different deformations. Thus, in one example a first compensation model may comprise a compensation factor associated with object volume while in other examples there may be no such compensation factor, or a different compensation factor may be used.

The surface area (and combinations of the volume and surface area) may be used to determine how 'solid' an object is. The amount of solid material in an object may be used to predict how the object may deform. For example, a more solid object may tend to accumulate more heat than a less solid object in a thermal fusing additive manufacturing operation. Such object generation parameters may therefore be mapped to different geometrical compensation parameters within a geometrical compensation model.

Other geometrical compensation models may for example include a consideration of how many objects are to be generated in a fabrication chamber and/or the proximity of the objects (for example in terms of 'packing density').

In other examples, other object generation parameter values (which may be object generation parameter values which are configurable or selectable by a user or operator) may be considered. The object generation parameter(s) may be any parameter which may have an impact on dimensional inaccuracy. For example, the object generation parameter(s) may comprise any, or any combination of, environmental conditions, object generation apparatus, object generation material composition (which may comprise selection of the type or composition of build material and/or print agents), object cooling profile, print mode, or the like. These may be specified, for example, by input to at least one processor. Thus, different geometrical compensation models and/or different parameters may be provided for different apparatus, different print modes, different cooling profiles or the like.

The geometrical compensation parameter(s) and/or geometrical compensation model(s) specifying such parameters may for example be stored in a memory, for example embodied as a mapping resource(s) such as lookup tables and the like, or may be embodied as one or more algorithm, for example relating object generation parameter(s) (e.g. any or any combination of object generation location, volume, surface area, packing density, environmental conditions, object generation apparatus, object generation material composition, object cooling profile or print mode) to a compensation to be applied to object model data.

The method of FIG. 1 comprises, in block 102, acquiring, by at least one processor, data for characterising geometrical modifications to apply to object model data representing at least a portion of an object to be generated by an additive manufacturing apparatus by fusing build material within a fabrication chamber to compensate for anticipated deformations in object generation. The data may for example be acquired from a memory, or over a network or the like.

In some examples, the data for characterising geometrical modifications to apply to object model data may comprise a data set based on indications of deviations between intended object dimensions and generated object dimensions for objects generated by a plurality of additive manufacturing apparatus (i.e. data from which a geometrical compensation model may be generated).

In some examples, the data for characterising geometrical modifications to apply to object model data comprises a first geometrical compensation model, which may have any of the characteristics of the geometrical compensation models described above and may characterise one or more geometrical compensation to be applied to object model data. Such geometrical modifications may comprise a parametrical transformation, for example a geometrical transformation such as at least one of an offset and a scaling factor. For example, a geometrical compensation may be specified as scaling and/or offset components in an X and Y axis (for example to be applied in a single slice of an object), or as scaling and/or offset components in an X, Y and Z axis. The first geometrical compensation model may be suitable for use with a range of manufacturing apparatus. In other words, the first geometrical compensation model may not be tailored to any specific manufacturing apparatus.

In some examples, a geometrical modification may be defined using two or three scaling factors (one for each of two/three axes, which may be orthogonal) and/or two or three offset values (one for each of two/three axes, which may be orthogonal). If scaling is not indicated in a given axis, the scaling factor in relation to that axis may be set to 1, and if no offset is indicated in a given axis, the offset value in relation to that axis may be set to 0.

Taking an example in which a scaling factor is specified in each of three orthogonal axes, this may in some examples be specified as a vector having components in the X, Y and Z directions, and may for example be specified as [$SF_x$, $SF_y$, $SF_z$]. This may, for example, taking the object in its intended generation orientation, mean that the 'width' of the object is to be scaled by $SF_x$, the 'depth' of the object is to be scaled by $SF_y$, and the 'height' of the object is to be scaled by $SF_z$ (noting that, in practice, the object may be generated in any orientation, and therefore the height of the object during generation may not correspond to the height of the object as orientated for use thereof following generation).

A geometrical compensation model may comprise one or a plurality of predefined geometrical compensations, and/or may comprise information used to derive geometrical compensation(s) to apply to object model data describing an object. In some examples, the model may specify one, or one set, of compensation parameters. In some examples, a model may be associated with expected input parameter(s) (such as object location, object volume, object surface area, build material, object generation parameters and the like) which are to be provided to determine geometrical compensation(s) to apply to an object. For example, there may be a mapping between such input parameter(s) and geometrical compensation(s).

Block 104 comprises acquiring, by at least one processor (which may comprise the same processor as used in block 102), an indication of deviations between intended object dimensions and generated object dimensions for objects generated by a first additive manufacturing apparatus. For example, this may comprise measuring a plurality of dimensions of at least one generated object, and/or receiving such measurements. In some examples, there may be tens, hundreds or even thousands of such data points acquired. In some examples, the measurements and/or the deviations may be determined remotely and transmitted to the at least one processor, for example over a network or the like. Measurements of dimensions to be used in block 104 may for example be acquired using at least one of 3D scanning, other optical measurement techniques and/or using manual measurements.

In some examples, the indication of deviations between intended object dimensions and generated object dimensions for objects which are generated by a first additive manufacturing apparatus applying a geometrical compensation model (which may be the first geometrical compensation model) to model data. In other words, the object model data used to generate the object(s) from which measurements have been acquired may have itself been modified by a compensation model, and may be used to derive a new or modified compensation model. In other examples, the objects may be generated based on object model data which has not been modified using compensation parameters.

The first data set may comprise measurements of the object dimensions from which deviations may be determined. In some examples, the processor(s) providing the method may for example have an awareness of an expected data set. For example, the objects to be printed by the first additive manufacturing apparatus may be predetermined, for example comprising a predetermined calibration set of objects. In some examples, the first data set may comprise deviations which are scaled by anticipated measurements.

The first data set may be gathered from objects generated in one or more build operations carried out using the first additive manufacturing apparatus. The objects may be generated in 'calibration' batches, which in some examples may comprise multiple instances of objects of a common design. In some examples, such instances of an object may be distributed throughout the volume of a fabrication chamber.

Block 106 comprises modifying, by at least one processor (which may comprise the same processor as used in block 102 and/or block 104), the data for characterising geometrical modifications based on the first data set. For example, such a modification may comprise combining the first data set with the data for characterising geometrical modifications, and/or modifying the data for characterising geometrical modifications with a scaling factor or an offset or the like.

Block 108 comprises deriving, by at least one processor (which may comprise the same processor as used in any or any combination of blocks 102, 104 and 106), a geometrical compensation model based on the modified data, wherein the derived geometrical compensation model is to compensate for anticipated deformations in object generation by the first additive manufacturing apparatus.

To consider an example of the operation of blocks 106 and 108 in a case where the data for characterising geometrical modifications is a first geometrical compensation model, the first data set may be used to derive an estimate of one or more apparatus-specific 'corrections' to the first geometrical model. The 'corrections' may be derived to compensate for the deviations from the expected measurements which are different to those compensated for by the first geometrical compensation model. Such 'corrections' may be embodied as offset value(s) and/or scaling factor(s), which in some examples may be added or combined with offset value(s) and/or scaling factor(s) set out in the first geometrical compensation model.

In some examples, such a first geometrical compensation model may be derived from a training set made up of measurements taken from objects generated by a plurality of different additive manufacturing apparatus. In some examples, these additive manufacturing apparatus may be of the same class of additive manufacturing apparatus as one another, and the first additive manufacturing apparatus may comprise a specific example of the class of additive manufacturing apparatus.

Generic models may perform well for some additive manufacturing apparatus and not for others. For example, a particular apparatus may be associated with a shift: at least one axis may be associated with a deformation which is fairly consistently under or over compensated for in a generic model. Such a shift may be taken into account by deriving an apparatus-specific geometrical compensation model.

For example, an apparatus-specific geometrical compensation model may be derived by applying a factor or adding/subtracting from the compensation model parameters of the first geometrical compensation model. Such modifications may be applied to derive a new parameter set, or may be determined as an operator to be applied to a parameter set once it has been derived/selected for use with a particular object model. In other words, the derived geometrical compensation model may comprise the first geometrical compensation model and at least one operator. For example, there may be one or a set of 'correction' parameters, which may include scaling factor(s) and/or offset value(s), in some examples specified for different ones of the x, y and z directions.

The first data set acquired in block 104 may indicate that, for objects generated by the first additive manufacturing apparatus, a particular scaling factor specified in the first geometrical compensation model in a particular dimension is too large or too small (or even suggests an increase in size when a decrease would be more suitable for the first additive manufacturing apparatus, or vice versa). In some examples, the data characterising the geometrical modifications (in this example, the parameters of the first compensation model) may be modified directly and individually to derive a new geometrical compensation model explicitly or natively. In some examples, 'corrections' to tailor the first geometrical compensation model to the first apparatus may be applied to the first compensation model as a whole (which compensates well for 'shifts' in offsets and scales which have been noted between additive manufacturing apparatus). For example, at least one multiplicative factor or offset may be associated (for example for at least one of each parameter type and/or each axis) with the first geometrical compensation model and therefore effectively derives a new geometrical compensation model. It is expected that any modification will be small, and therefore any multiplicative factor may be close to 1. The offset may for example be the difference in the mean of the parameters of a certain type in a certain axis (e.g. the scaling factor to be applied in the x axis for each of a plurality of locations, or the offset value to be applied in the z axis for each of a plurality of locations) with the mean of the same factor determined from the first data set (or the first geometrical compensation model). This effectively shifts the compensation model for a parameter.

However, where the model includes a mapping between object generation parameters (e.g. location of object generation, object volume, object surface area or the like), complex behaviours of a particular additive manufacturing apparatus may be reflected in the derived geometrical compensation model by modifying individual parameters of the first geometrical compensation model separately. For example, a particular additive manufacturing apparatus may have greater object shrinkage in a given first zone of the fabrication chamber than is shown in the first geometrical compensation model, whereas in a second zone the behaviour of that additive manufacturing apparatus may conform well to the first model. In such an example, geometrical compensation model parameters associated with the first zone may be adjusted to a greater extent than parameters of the second zone.

In other words, in some examples, for example where the modifications are associated with factors such as object location, volume, surface area, object generation parameters or the like, this may be taken into account when modifying the first geometrical compensation model. For example, compensation parameters associated with a particular location of object generation may be modified based on object dimensions of an object generated by the first additive manufacturing apparatus in that location. In another example, compensation parameters associated with object volume may be modified based on object dimensions of a generated object having at least approximately that location. Any, or any combination of factors may be taken into account. The modification may comprise a scaling and/or an offset of a corresponding parameter of the first geometrical compensation model.

As briefly mentioned above, in some examples, In some examples, the data for characterising geometrical modifications to apply to object model data acquired in block 102 may comprise a data set based on indications of deviations between intended object dimensions and generated object dimensions for objects generated by a plurality of additive manufacturing apparatus (i.e. data from which a geometrical compensation model may be generated). In such examples, the first data set may be combined with that data set which may be used to derive the first geometrical compensation model, rather than being used to adapt an existing geometrical compensation model. Such an example is discussed in greater detail with reference to FIG. 2 below.

In summary then, the method of FIG. 1 may allow a derived geometrical compensation model to be tailored to the first additive manufacturing apparatus, for example by deriving or modifying compensation parameters to be applied to object model data modelling objects to be generated by the first additive manufacturing apparatus in a future additive manufacturing operation, in order to derive or update a geometrical compensation model.

By using an apparatus-specific geometrical compensation model, a greater degree of geometrical accuracy may be obtained. Moreover, by modifying existing geometrical compensation data (for example, a model or a data set which maybe basis for deriving such a model), an improvement may be made based on a relatively small number of test objects. For example, a multiplicative or additive shift (a single number, or a single number for at least one axis and/or parameter type) to apply to a geometrical compensation model may be determined using a relatively small number of generated objects. For example, the inventors have shown that a generic model may be improved in this way using measurements obtained from around 10-20 objects, with a number of measurements being acquired in each direction. In practice at least three measurements may be acquired for each object in each direction to infer a scale and an offset value for that object in that direction. If different adjustments are to be made to parameters relating to different object generation conditions, a larger number of objects may be generated (in one example, around 100 objects) to ensure any adjustments made to the existing geometrical compensation data are robust.

Figure 2:
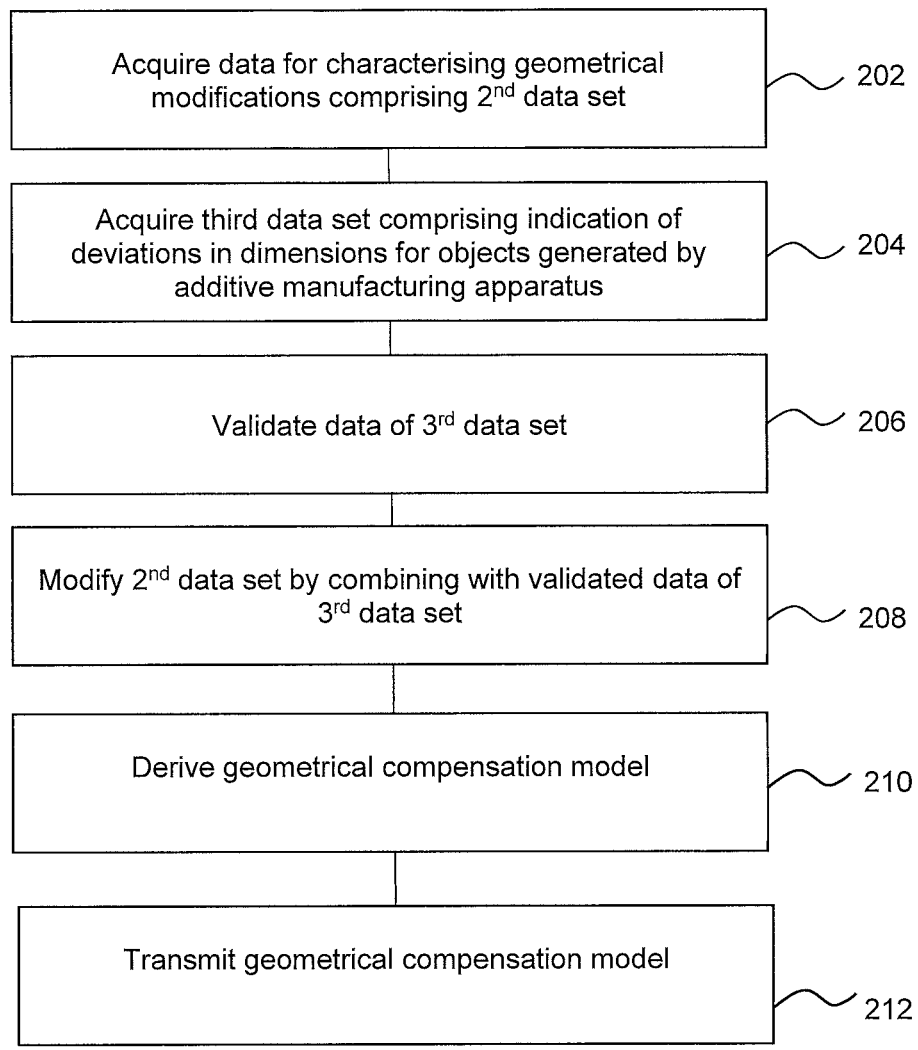

FIG. 2 shows an example of a method comprising, in block 202, acquiring data for characterising geometrical modifications which comprises a data set, referred to as a second data set here to distinguish from the first data set above. The second data set is based on indications of deviations between intended object dimensions and generated object dimensions for objects generated by a plurality of additive manufacturing apparatus. In other words, the second data set may provide data for deriving a 'general' geometrical compensation model. This may be an example of a method of carrying out block 102.

Block 204 comprises acquiring, at the at least one processor, a third data set comprising an indication of deviations between intended object dimensions and generated object dimensions for objects generated by a particular additive manufacturing apparatus (e.g. the first or a second additive manufacturing apparatus). This may be carried out as described in relation to block 104 above, and the third data set may have any of the features of (or indeed may comprise) the first data set.

In this example, block 206 comprises validating data of the third data set. For example, data which indicates a large deviation may be due to a malfunction, noise introduced in the measurement process or the like. In such cases, it may be preferred to reject that data point (or indeed in some examples, to request a new data set entirely) to avoid deriving a new model based on data which is unlikely to be characteristic of that additive manufacturing apparatus. In some examples, an acceptable data range (or the threshold for determining what constitutes a 'large' deviation) may be derived in the context of the data set. For example, a single large deviation in a data set which is otherwise indicative of relatively small deviations may be rejected, but a similarly large deviation in a data set in which large deviations are relatively common may be maintained. This may allow a trend to be distinguished from, for example, a measurement anomaly. In other examples abnormal measurements (which may lead to abnormal (for example large) estimations of scale/offset) may be evaluated in relation to individual measurements. In other examples, abnormal estimations of scale/offset scales or corrections (for example, corrections of scale, or an estimate of a scale, which are more than a threshold distance from 1 or corrections of offset, or an estimate of offset which is above a threshold magnitude may be rejected, and/or such values may be capped. In some examples, if the data is incomplete (for example, at least a threshold number of expected measurements is missing or rejected), the data set may be rejected.

Block 208 comprises modifying, by the at least one processor, the second data set by combining it with the validated data of the third data set (e.g. data points which are not rejected as part of the validation). In some examples, the third data set is given a greater weighting than data relating to objects generated by any other additive manufacturing apparatus. For example, the third data set (which is derived from objects generated by a single additive manufacturing apparatus) may be given equal weight to the second data set (which is gathered from a plurality of additive manufacturing apparatus). In some examples, the weighting for the third dataset may be disproportionate when compared to the weighting of the second dataset when considering the size of the data set. For example, while there may be fewer or the same number of data points in the third data set, each data point may be given a higher weighting than a data point in the second data set in the combination. Expressed another way, the average weighting of a data point in the third data set may be greater than the average weighting of each data point in the second data set. The weighting may for example depend on the size of the third data set, with the weighting given thereto increasing with the size. In some examples, the weighting may for example depend on the magnitude of the difference between scale and/or offset parameter(s) indicated by the second data set and scale and/or offset parameter(s) specified by the third data set (i.e. how similar the behaviour of the additive manufacturing apparatus is to the 'average' behaviour of the plurality of additive manufacturing apparatus used to generate the objects from which the second data set is derived). In some examples, the weighting may be set by an operator or the like.

This combined data is used to derive, in block 210, a geometrical compensation model, wherein the derived geometrical compensation model is to compensate for anticipated deformations in object generation by the additive manufacturing apparatus used to generate the objects from which the third data set was obtained.

Block 212 comprises transmitting the derived geometrical compensation model to the additive manufacturing apparatus used to generate the objects from which the third data set was obtained.

In other words, the apparatus-specific geometrical compensation model may be derived remotely from the additive manufacturing apparatus for which the model has been tailored, and transmitted thereto, for example over a network or the like. A particular general geometrical compensation model or data set maybe modified for each of a plurality of specific additive manufacturing apparatus.

Blocks of FIG. 1 and FIG. 2 may be combined. For example, the method of FIG. 1 may additionally comprise any of blocks 206-212.

Data for characterising geometrical modifications may be tailored to a plurality of different individual additive manufacturing apparatus to derive apparatus-specific geometrical compensation model using such methods.

Objects to be generated by the additive manufacturing apparatus may be described using object model data. The object model data may comprise data representing at least a portion (in some examples, a slice) of an object to be generated by an additive manufacturing apparatus by fusing a build material. The object model data may for example comprise a Computer Aided Design (CAD) model, and/or may for example be a STereoLithographic (STL) data file. In some examples, the object model data may represent the object or object portion as a plurality of sub-volumes, wherein each sub-volume represents a region of the object which is individually addressable in object generation. In some examples herein, the sub-volumes may be referred to as voxels, i.e. three-dimensional pixels. In some examples, the object model data may represent a printable arrangement of a plurality of objects to be generated by an additive manufacturing apparatus by fusing build material within a fabrication chamber.

Methods of object generation may comprise determining object generation instructions (or 'print instructions') for generating the object. The object generation instructions in some examples may specify an amount of print agent to be applied to each of a plurality of locations on a layer of build material. For example, deriving object generation instructions may comprise determining 'slices' of a virtual build volume comprising virtual object(s) (to which a modification may have been applied) and rasterising these slices into pixels (or voxels, i.e. three-dimensional pixels). An amount of print agent (or no print agent) may be associated with each of the pixels/voxels. For example, if a pixel relates to a region of a build volume which is intended to solidify, the object generation instructions may be derived to specify that fusing agent should be applied to a corresponding region of build material in object generation. If however a pixel relates to a region of the build volume which is intended to remain unsolidified, then object generation instructions may be derived to specify that no agent, or a coalescence modifying agent such as a detailing agent, may be applied thereto, for example to cool the build material. In addition, the amounts of such agents may be specified in the derived instructions and these amounts may be determined based on, for example, thermal considerations and the like. In other examples, object generation instructions may specify how to direct directed energy, or how to place a curing or binding agent or the like.

Generating an object may comprise generating the object based on object generation instructions (or 'print instructions'). For example, such an object may be generated layer by layer. For example, this may comprise forming a layer of build material, applying print agents, for example through use of 'inkjet' liquid distribution technologies in locations specified in the object generation instructions for an object model slice corresponding to that layer using at least one print agent applicator, and applying energy, for example heat, to the layer. Some techniques allow for accurate placement of print agent on a build material, for example by using print heads operated according to inkjet principles of two-dimensional printing to apply print agents, which in some examples may be controlled to apply print agents with a resolution of around 600 dpi, or 1200 dpi. A further layer of build material may then be formed and the process repeated, for example with the object generation instructions for the next slice. In other examples, objects may be generated using directed energy, or through use of chemical binding or curing, or in some other way.

By using a suitable compensation model—i.e. a compensation model which is tailored to a particular apparatus—to modify object model data, an object once formed may end up being closer to an intended size.

In some examples, the methods set out herein may be combined with other methods of object model modification. For example, a modification function may be employed in the vicinity, or locality, of small features. An erosion of such small features may result in an unacceptable reduction in their size, either obliterating the feature or rendering it too small to fuse or too delicate to survive cleaning operations. For example, if a feature has a dimension of around 0.5 mm, this may correspond to 12 voxels at 600 dpi. If three or four voxels are eroded from the side of such a small feature, it will lose approximately 50 to 60% of its cross-section, reducing its size to less than 0.3 mm. Such a feature may be too small to survive cleaning operations. Thus, in some examples, other functions may be used to ensure that small features are preserved.

Figure 3:
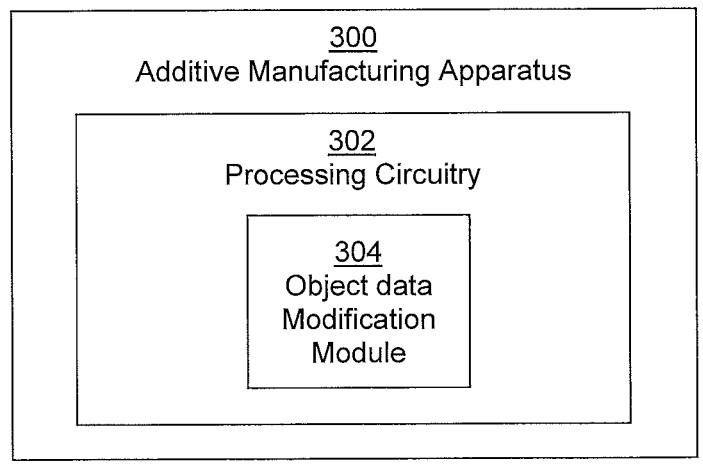
FIGS. 3 and 4 are simplified schematic drawings of example apparatus for additive manufacturing.

FIG. 3 shows an additive manufacturing apparatus 300 comprising processing circuitry 302, the processing circuitry 302 comprising an object data modification module 304.

In use of the apparatus 300, the additive manufacturing apparatus 300 generates a calibration object batch, which may be predetermined, and wherein the deviations between intended object dimensions and generated object dimensions for objects of the calibration object batch are used to derive a first geometrical transformation model. The derived geometrical transformation model may have any of the features of the geometrical compensation models discussed above, and may be intended to compensate for anticipated departures in dimensions from intended dimensions on object generation.

For example, the calibration object batch may comprise a set of objects, which may in some examples comprise a plurality of instances of objects manufactured from the same underlying object model data. In some examples the object model data used in generating the object(s) has been modified by a current geometrical transformation model. In some examples, the calibration batch may be generated in a single build operation, which may include a plurality of instances of a particular object distributed throughout a fabrication chamber.

In a subsequent use of the apparatus 300, the object data modification module 304 may apply the derived geometrical transformation model to object model data describing an object to be generated in additive manufacturing. For example, this may comprise determining a geometrical transformation for an object to be generated using additive manufacturing based on the geometrical transformation model and modifying the object model data using the geometrical transformation. In some examples, the object data modification module 304 determines at least one object generation parameter. The object generation parameter may comprise at least one of: an intended object placement within a fabrication chamber, object volume, and a ratio of object volume and object surface area. In some examples, the object data modification module 304 determines a geometrical compensation to apply to object model data describing the object using the object parameter and the derived geometrical transformation model.

In some examples, a previous geometrical transformation model may be updated with the first geometrical transformation model, which as noted above, is generated based on deviations between intended object dimensions and generated object dimensions for objects generated by the additive manufacturing apparatus. In some examples, the generated objects may have been generated using a previous geometrical transformation model. In other examples, the deviations between intended object dimensions and generated object dimensions for objects generated by the additive manufacturing apparatus may be combined with a general data set and used to derive the first geometrical transformation model, for example as described in relation to FIG. 2 above.

A previous geometrical transformation model may be updated by being replaced by the first geometrical transformation model, or by modification thereof to derive the first geometrical transformation model. The update to be applied may be determined by the processing circuitry 302, or remotely therefrom.

In use, the additive manufacturing apparatus 300 may generate an object using object model data modified using any current geometrical transformation model, or without use of a geometrical transformation model.

For example, the additive manufacturing apparatus 300, in use thereof, may generate the object in a plurality of layers (which may correspond to respective slices of an object model) according to object generation instructions. The additive manufacturing apparatus 300 may for example generate an object in a layer-wise manner by selectively solidifying portions of layers of build material. The selective solidification may in some examples be achieved by selectively applying print agents, for example through use of 'inkjet' liquid distribution technologies, and applying energy, for example heat, to the layer. In other examples, heat may be selectively applied, and/or chemical agents such as curing or binding agents may be applied. The additive manufacturing apparatus 300 may comprise additional components not shown herein, for example any or any combination of a fabrication chamber, a print bed, printhead(s) for distributing print agents, a build material distribution system for providing layers of build material, energy sources such as heat lamps and the like.

The object generation instructions (or print instructions), which may be derived by the processing circuitry 302 may control the additive manufacturing apparatus 300 to generate each of the plurality of layers of the object. This may for example comprise specifying area coverage(s) for print agents such as fusing agents, colorants, detailing agents and the like. In some examples, such object generation parameters are associated with object model sub-volumes. In some examples, other parameters, such as any, or any combination of heating temperatures, build material choices, an intent of the print mode, and the like, may be specified. In some examples, halftoning may be applied to determine where to place fusing agent or the like. The object generation instructions may be specified in association with sub-volumes (e.g. voxels as described above). In some examples, the object generation instructions comprise a print agent amount associated with sub-volumes.

In some examples, object generation may comprise a fusing process, for example a thermal fusing process in which heat is applied.

The apparatus 300 may comprise a memory resource to store at least one geometrical transformation model. For example, this may comprise any or any combination of mapping resources, transformation vector(s), compensation parameter(s), algorithm(s) or the like, as have been described above. The geometrical transformation models may be intended to compensate for object deformation in additive manufacturing, wherein each geometrical transformation model may specify or determine a compensation to apply based on predetermined criteria, which may differ between models. In some examples, as has been discussed above, the models may relate the compensation to be applied to any of object placement locations within a fabrication chamber, object volume, object surface area, or the like. The geometrical transformation model(s) may have any of the features of the geometrical compensation models discussed above.

Figure 4:
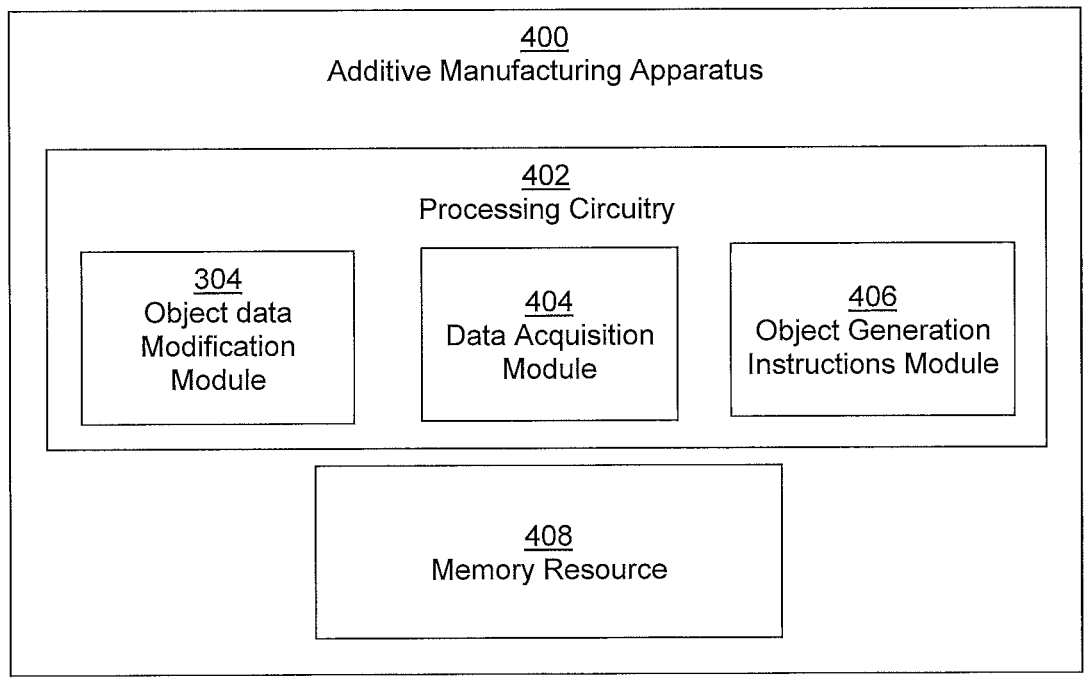

FIG. 4 shows an example of an additive manufacturing apparatus 400 comprising processing circuitry 402, wherein the processing circuitry 402 comprises the object data modification module 304 described in relation to FIG. 3. In addition, the apparatus 400 further comprises a data acquisition module 404, an object generation instructions module 406 and a memory resource 408 to store geometrical transformation model(s).

In use of the apparatus 400, the data acquisition module 404 acquires data indicative of deviations between intended object dimensions and generated object dimensions for objects generated by the additive manufacturing apparatus 400 applying the first geometrical transformation model. For example, this may comprise a 3D scanner, or a data input terminal for receiving input measurements, and/or may determine the deviations from such measurements.

In use of the apparatus 400, the object generation instructions module 406 determines object generation instructions for generating the object. As discussed in greater detail above, the object generation instructions may in some examples specify an amount of print agent to be applied to each of a plurality of locations on a layer of build material, and may be derived based on object model data modified using the current geometrical transformation model.

The processing circuitry 302, 402 or the modules thereof may carry out any of the blocks of FIG. 1 or FIG. 2 to derive the first geometrical transformation model. In other examples, the first geometrical transformation model may be derived remotely from the apparatus 300, 400 and transmitted thereto.

Figure 5:
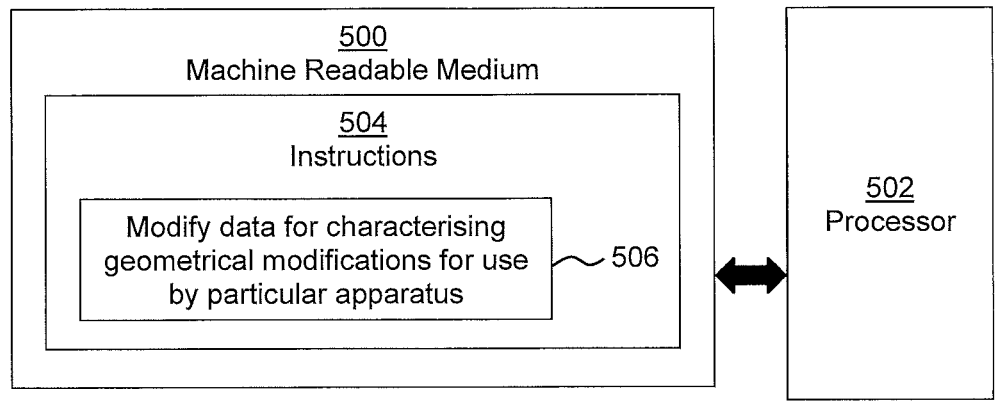
FIG. 5 is a simplified schematic drawing of an example machine-readable medium associated with a processor.

FIG. 5 shows a tangible machine-readable medium 500 associated with a processor 502. The machine-readable medium 500 comprises instructions 504 which, when executed by the processor 502, cause the processor 502 to carry out tasks. In this example, the instructions 504 comprise instructions 506 to cause the processor 502 to modify data for characterising geometrical modifications for use by each of a plurality of additive manufacturing apparatus, wherein the modification for a particular additive manufacturing apparatus is based on dimensions of objects generated by that apparatus. The objects generated by that apparatus may have been generated using data derived from or comprising the data for characterising geometrical modifications. The data for characterising geometrical modifications may comprise a geometrical compensation model and/or a data set from which such a model may be derived. The instructions may modify the data to generate a geometrical compensation model. Such a geometrical compensation model may comprise at least one scaling factor and/or at least one offset value, where in each of the scaling factors and each of the offset values may be associated with one of three orthogonal axes. In some examples, the modification is further based on a location of object generation. In some examples, the modification is based on dimensions of a plurality of test (or calibration) objects, which may be a predetermined set of calibration objects.

In some examples, the instructions 504 comprise instructions which, when executed, cause the processor 502 to transmit a geometrical compensation model to the additive manufacturing apparatus which generated the objects used to determine the modification.

In some examples, the instructions when executed cause the processor 502 to carry out any of the blocks of FIG. 1 or FIG. 2. In some examples, the instructions may cause the processor 502 to act as any part of the processing circuitry 302, 402 of FIG. 3 or FIG. 4. The machine-readable medium 500 may for example provide the memory resource 408 of FIG. 4.

Figure 6A:
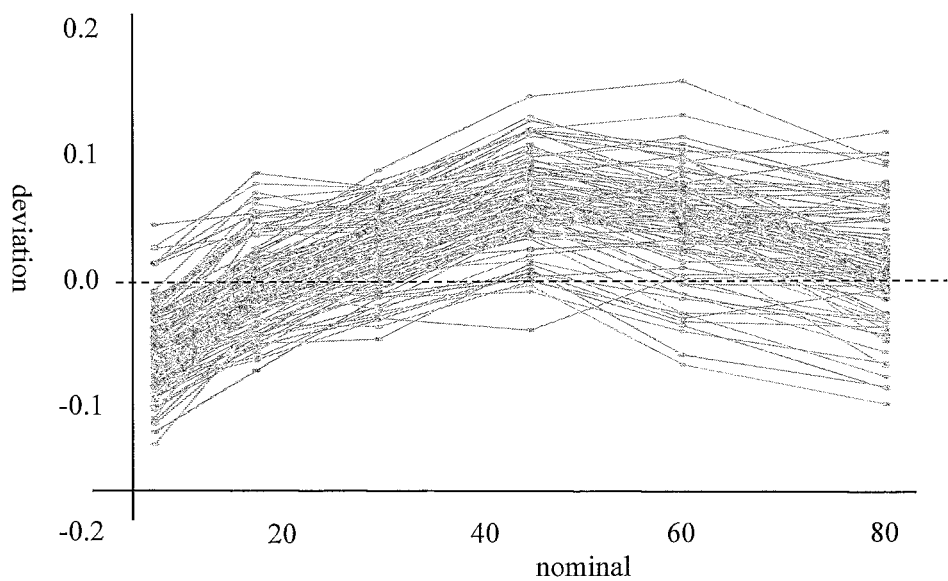
FIG. 6A-6C show examples of dimensions of objects generated using additive manufacturing.
Figure 6B:
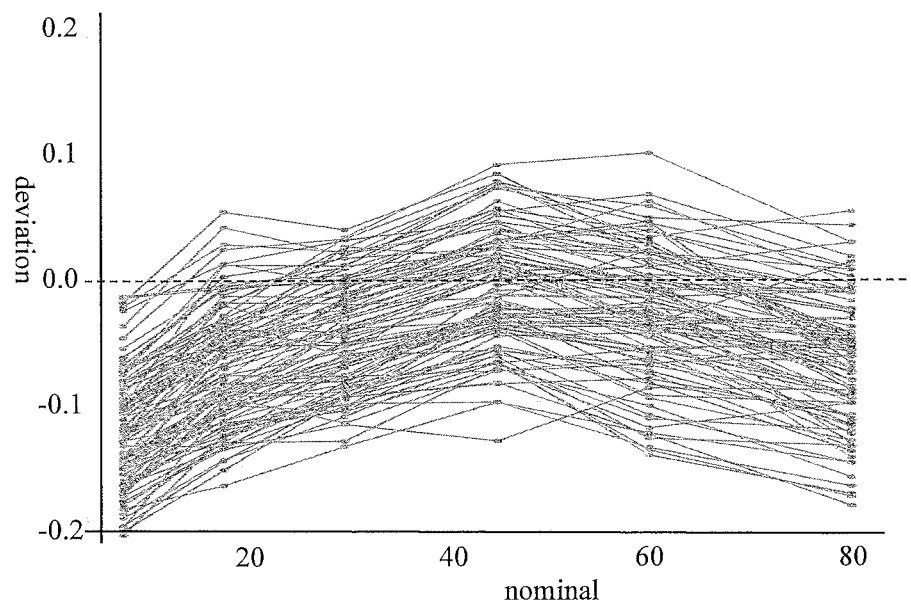
Figure 6C:
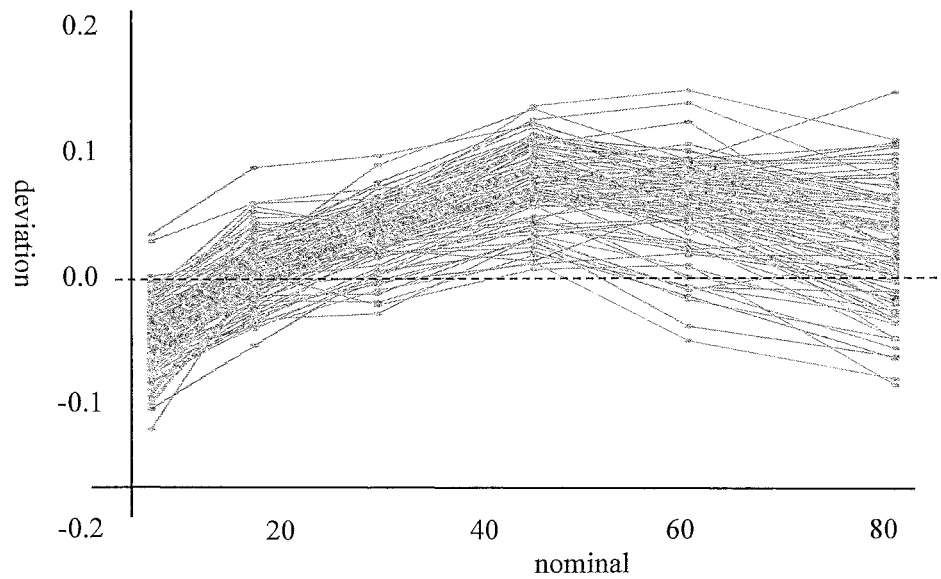

FIGS. 6A, 6B and 6C show examples of data gathered from objects printed on a particular additive manufacturing apparatus without compensation (FIG. 6A), objects printed on that same additive manufacturing apparatus using a general compensation model (FIG. 6B), and objects printed on that same additive manufacturing apparatus using a compensation model which was derived specifically for that additive manufacturing apparatus (FIG. 6C).

In this case, the general compensation model used in FIG. 6B was derived using 5400 measurements taken from objects generated by three different additive manufacturing apparatus. In this example, each additive manufacturing apparatus generated batches based on the same underlying object model data. This model was tailored to provide the specific compensation model used to generate the objects which are the basis of the data in FIG. 6C using a single build operation on the apparatus wherein the underlying object model data had been corrected using the general compensation model when performing the build operation. In this example, 1800 measurements were acquired from this (single) build operation which generated 132 objects. Around 500 measurements were taken in each of the X and Y direction and 800 were taken in the Z direction.

The data shown is a proportional deviation from an expected measurement taken in the X axis (i.e. within the plane of a layer of object generation), with each line showing a plurality of measurements taken at different points at a nominal distance along a particular object. The deviation from the expected measurement at that nominal distance is shown (i.e. the difference between the measured dimension and the dimension specified in original model data).

It may be noted that the lines shown in FIG. 6A are centred broadly around 0, indicating that dimensions may be greater or smaller than the expected dimensions in roughly equal amounts. However, the compensation model used in FIG. 6B has resulted in a shift: objects are generally smaller than expected in the x dimension, and the average deviation magnitude is greater. When the compensation model which was derived specifically for that additive manufacturing apparatus was used, as is shown in FIG. 6C, this shift is compensated for and the spread of deviations is also reduced.

The following table compares process capability metrics Cp and Cpk metrics for objects generated by additive manufacturing. Cp (Process Capability) measures the ability of a process to produce output within specification limits whereas Cpk (Process Capability Index) includes an adjustment of Cp for the effect of non-centered distributions.

The data shows average values in the x, y and z dimensions for objects generated based on (i) object model data which is not operated on by any compensation model ("no compensation"), (ii) object model data which is operated on by a general compensation model, and (iii) object model data which is operated on by a compensation model which has been tailored to the particular apparatus ("specific compensation model"). A higher Cp value indicates better precision and repeatability, effectively showing that the distribution of the errors is more compact. A higher Cpk value also indicates a reduction in absolute errors, an increase in accuracy, and that the average behaviour is closer to the nominal expected average (in this case, 0).

While both compensation models improve the repeatability of object generation, the specific compensation model performs better in most of the categories.

| X (average) | Cp | Cpk |
|---|---|---|
| No compensation | 1.46 | 1.03 |
| General compensation model | 1.85 | 1.53 |
| Specific compensation model | 2.26 | 1.79 |
| Y (average) | | |
| No compensation | 1.11 | 0.76 |
| General compensation model | 1.31 | 1.05 |
| Specific compensation model | 1.38 | 1.08 |
| Z (average) | | |
| No compensation | 0.85 | −0.21 |
| General compensation model | 0.93 | 0.39 |
| Specific compensation model | 0.90 | 0.57 |

Examples in the present disclosure can be provided as methods, systems or machine-readable instructions, such as any combination of software, hardware, firmware or the like. Such machine-readable instructions may be included on a computer readable storage medium (including but not limited to disc storage, CD-ROM, optical storage, etc.) having computer readable program codes therein or thereon.

The present disclosure is described with reference to flow charts and/or block diagrams of the method, devices and systems according to examples of the present disclosure. Although the flow diagrams described above show a specific order of execution, the order of execution may differ from that which is depicted. Blocks described in relation to one flow chart may be combined with those of another flow chart. It shall be understood that each block in the flow charts and/or block diagrams, as well as combinations of the blocks in the flow charts and/or block diagrams can be realized by machine-readable instructions.

The machine-readable instructions may, for example, be executed by a general purpose computer, a special purpose computer, an embedded processor or processors of other programmable data processing devices to realize the functions described in the description and diagrams. In particular, a processor or processing apparatus may execute the machine-readable instructions. Thus functional modules of the apparatus (such as the object data modification module 304, the data acquisition module 404 and the object generation instructions module 406) may be implemented by a processor executing machine-readable instructions stored in a memory, or a processor operating in accordance with instructions embedded in logic circuitry. The term 'processor' is to be interpreted broadly to include a CPU, processing unit, ASIC, logic unit, or programmable gate array etc. The methods and functional modules may all be performed by a single processor or divided amongst several processors.

Such machine-readable instructions may also be stored in a computer readable storage that can guide the computer or other programmable data processing devices to operate in a specific mode.

Machine-readable instructions may also be loaded onto a computer or other programmable data processing devices, so that the computer or other programmable data processing devices perform a series of operations to produce computer-implemented processing, thus the instructions executed on the computer or other programmable devices realize functions specified by flow(s) in the flow charts and/or block(s) in the block diagrams.

Further, the teachings herein may be implemented in the form of a computer software product, the computer software product being stored in a storage medium and comprising a plurality of instructions for making a computer device implement the methods recited in the examples of the present disclosure.

While the method, apparatus and related aspects have been described with reference to certain examples, various modifications, changes, omissions, and substitutions can be made without departing from the spirit of the present disclosure. It is intended, therefore, that the method, apparatus and related aspects be limited by the scope of the following claims and their equivalents. It should be noted that the above-mentioned examples illustrate rather than limit what is described herein, and that those skilled in the art will be able to design many alternative implementations without departing from the scope of the appended claims. Features described in relation to one example may be combined with features of another example.

The word "comprising" does not exclude the presence of elements other than those listed in a claim, "a" or "an" does not exclude a plurality, and a single processor or other unit may fulfil the functions of several units recited in the claims.

The features of any dependent claim may be combined with the features of any of the independent claims or other dependent claims.

What is claimed is:

1. A method comprising:
    acquiring, by a processor, data characterizing geometrical modifications to apply to compensate for anticipated deformations in additive object manufacture, the geometrical modifications associated with a plurality of additive manufacturing apparatuses;
    acquiring, by the processor, a data set indicating deviations between intended object dimensions of calibration objects and actual object dimensions of the calibration objects as generated by a specific additive manufacturing apparatus;
    modifying, by the processor, the data characterizing the geometrical modifications associated with the plurality of additive manufacturing apparatuses based on the data set for the specific additive manufacturing apparatus;
    deriving, by the processor, an apparatus-specific geometrical compensation model based on the modified data, the apparatus-specific geometrical compensation model compensating for the anticipated deformations in additive object manufacture by the specific additive manufacturing apparatus;
    modifying, by the processor, object model data for an object by applying the apparatus-specific geometrical compensation model to the object model data; and
    causing, by the processor, the specific additive manufacturing apparatus to additively manufacture the object in accordance with the modified object model data.

2. The method of claim 1, wherein the data characterizing the geometrical modifications associated with the plurality of additive manufacturing apparatuses comprises a generalized geometrical compensation model not specific to any particular additive manufacturing apparatus,
    and wherein modifying the data characterizing geometrical modifications and deriving the apparatus-specific geometrical compensation model comprises modifying the generalized geometrical compensation model based on the data set for the specific additive manufacturing apparatus to derive the apparatus-specific geometrical compensation model.

3. The method of claim 1, wherein the specific additive manufacturing apparatus is a first specific additive manufacturing apparatus, and the data set for the specific additive manufacturing apparatus is a first data set,
    wherein the data characterizing the geometrical modifications associated with the plurality of additive manufacturing apparatuses comprise second data set indicating deviations between the intended object dimensions of the calibration objects and the actual object dimensions of the calibration objects as generated by each of a plurality of second specific additive manufacturing apparatuses,
    and wherein modifying the data characterizing the geometrical modifications associated with the plurality of additive manufacturing apparatuses comprises combining the first data set and the second data set for each second specific additive manufacturing apparatus such that the first data set is given greater weighting than the second data set for each second specific additive manufacturing apparatus.

4. The method of claim 1, wherein the specific additive manufacturing apparatus is a first specific additive manufacturing apparatus, the data set for the specific additive manufacturing apparatus is a first data set, and the apparatus-specific geometrical compensation model is a first apparatus-specific geometrical compensation model, the method further comprising:
    acquiring, by the processor, a second data set indicating deviations between the intended object dimensions of the calibration objects and actual object dimensions of the calibration objects as generated by a second specific additive manufacturing apparatus;
    modifying, by the processor, the data characterizing the geometrical modifications associated with the plurality of additive manufacturing apparatuses based on the second data set for the second specific additive manufacturing apparatus;
    deriving, by the processor, a second apparatus-specific geometrical compensation model based on the data modified based on the second data set, the second apparatus-specific geometrical compensation model compensating for the anticipated deformations in additive object manufacture by the second specific additive manufacturing apparatus;
    modifying, by the processor, the object model data for the object by applying the second apparatus-specific geometrical compensation model to the object model data; and
    causing, by the processor, the second specific additive manufacturing apparatus to additively manufacture the object in accordance with the object model data as modified by applying the second apparatus-specific geometrical compensation model to the object model data.

5. The method of claim 1, further comprising:
    validating, by the processor, the data set to determine if the deviations falls within an expected range.

6. The method of claim 1, wherein the apparatus-specific geometrical compensation model specifies a plurality of parameters that are each associated with a different location within a fabrication chamber of the specific additive manufacturing apparatus, each parameter comprising either or both of a scaling factor and an offset value.

7. A non-transitory machine-readable medium storing instructions executable by a processor to perform processing comprising:
    acquiring data characterizing geometrical modifications to apply to compensate for anticipated deformations in additive object manufacture, the geometrical modifications associated with a plurality of additive manufacturing apparatuses;
    acquiring a data set indicating deviations between intended object dimensions of calibration objects and actual object dimensions of the calibration objects as generated by a specific additive manufacturing apparatus;

modifying the data characterizing the geometrical modifications associated with the plurality of additive manufacturing apparatuses based on the data set for the specific additive manufacturing apparatus;

deriving an apparatus-specific geometrical compensation model based on the modified data, the apparatus-specific geometrical compensation model compensating for the anticipated deformations in additive object manufacture by the specific additive manufacturing apparatus;

modifying object model data for an object by applying the apparatus-specific geometrical compensation model to the object model data; and causing the specific additive manufacturing apparatus to additively manufacture the object in accordance with the modified object model data.

8. The non-transitory machine-readable medium of claim 7, wherein the data characterizing the geometrical modifications associated with the plurality of additive manufacturing apparatuses comprises a generalized geometrical compensation model not specific to any particular additive manufacturing apparatus, and wherein modifying the data characterizing geometrical modifications and deriving the apparatus-specific geometrical compensation model comprise modifying the generalized geometrical compensation model based on the data set for the specific additive manufacturing apparatus to derive the apparatus-specific geometrical compensation model.

9. The non-transitory machine-readable medium of claim 7, wherein the specific additive manufacturing apparatus is a first specific additive manufacturing apparatus, and the data set for the specific additive manufacturing apparatus is a first data set, wherein the data characterizing the geometrical modifications associated with the plurality of additive manufacturing apparatuses comprises second data set indicating deviations between the intended object dimensions of the calibration objects and the actual object dimensions of the calibration objects as generated by each of a plurality of second specific additive manufacturing apparatuses, and wherein modifying the data characterizing the geometrical modifications associated with the plurality of additive manufacturing apparatuses comprises combining the first data set and the second data set such that the first data set is given greater weighting than the second data set.

10. The non-transitory machine-readable medium of claim 7, wherein the specific additive manufacturing apparatus is a first specific additive manufacturing apparatus, the data set for the specific additive manufacturing apparatus is a first data set, and the apparatus-specific geometrical compensation model is a first apparatus-specific geometrical compensation model, the processing further comprising:

acquiring a second data set indicating deviations between the intended object dimensions of the calibration objects and actual object dimensions of the calibration objects as generated by a second specific additive manufacturing apparatus;

modifying the data characterizing the geometrical modifications associated with the plurality of additive manufacturing apparatuses based on the second data set for the second specific additive manufacturing apparatus;

deriving a second apparatus-specific geometrical compensation model based on the data modified based on the second data set, the second apparatus-specific geometrical compensation model compensating for the anticipated deformations in additive object manufacture by the second specific additive manufacturing apparatus;

modifying the object model data for the object by applying the second apparatus-specific geometrical compensation model to the object model data; and causing the second specific additive manufacturing apparatus to additively manufacture the object in accordance with the object model data as modified by applying the second apparatus-specific geometrical compensation model to the object model data.

11. The non-transitory machine-readable medium of claim 7, wherein the processing further comprises:

validating the data set to determine if the deviations falls within an expected range.

12. The non-transitory machine-readable medium of claim 7, wherein the apparatus-specific geometrical compensation model specifies a plurality of parameters that are each associated with a different location within a fabrication chamber of the specific additive manufacturing apparatus, each parameter comprising either or both of a scaling factor and an offset value.

13. A system comprising:

a processor; and a memory storing program code executable by the processor to:

acquire data characterizing geometrical modifications to apply to compensate for anticipated deformations in additive object manufacture, the geometrical modifications associated with a plurality of additive manufacturing apparatuses;

acquire a data set indicating deviations between intended object dimensions of calibration objects and actual object dimensions of the calibration objects as generated by a specific additive manufacturing apparatus;

modify the data characterizing the geometrical modifications associated with the plurality of additive manufacturing apparatuses based on the data set for the specific additive manufacturing apparatus;

derive an apparatus-specific geometrical compensation model based on the modified data, the apparatus-specific geometrical compensation model compensating for the anticipated deformations in additive object manufacture by the specific additive manufacturing apparatus;

modify object model data for an object by applying the apparatus-specific geometrical compensation model to the object model data; and cause the specific additive manufacturing apparatus to additively manufacture the object in accordance with the modified object model data.

14. The system of claim 13, wherein the data characterizing the geometrical modifications associated with the plurality of additive manufacturing apparatuses comprises a generalized geometrical compensation model not specific to any particular additive manufacturing apparatus, and wherein the program code is executable to modify the data characterizing geometrical modifications and derive the apparatus-specific geometrical compensation model by modifying the generalized geometrical compensation model based on the data set for the specific additive manufacturing apparatus to derive the apparatus-specific geometrical compensation model.

15. The system of claim 13, wherein the specific additive manufacturing apparatus is a first specific additive manufacturing apparatus, and the data set for the specific additive manufacturing apparatus is a first data set, wherein the data characterizing the geometrical modifications associated with the plurality of additive manufacturing apparatuses comprises second data set indicating deviations between the intended object dimensions of the calibration objects and the actual object dimensions of the calibration objects as generated by each of a plurality of second specific additive manufacturing apparatuses, and wherein the program code is executable to modify the data characterizing the geometrical modifications associated with the plurality of additive manufacturing apparatuses by combining the first data set and the second data set such that the first data set is given greater weighting than the second data set.

16. The system of claim 13, wherein the specific additive manufacturing apparatus is a first specific additive manufacturing apparatus, the data set for the specific additive manufacturing apparatus is a first data set, and the apparatus-specific geometrical compensation model is a first apparatus-specific geometrical compensation model, the program code executable by the processor to further:

acquire a second data set indicating deviations between the intended object dimensions of the calibration objects and actual object dimensions of the calibration objects as generated by a second specific additive manufacturing apparatus;

modify the data characterizing the geometrical modifications associated with the plurality of additive manufacturing apparatuses based on the second data set for the second specific additive manufacturing apparatus;

derive a second apparatus-specific geometrical compensation model based on the data modified based on the second data set, the second apparatus-specific geometrical compensation model compensating for the anticipated deformations in additive object manufacture by the second specific additive manufacturing apparatus;

modify the object model data for the object by applying the second apparatus-specific geometrical compensation model to the object model data; and cause the second specific additive manufacturing apparatus to additively manufacture the object in accordance with the object model data as modified by applying the second apparatus-specific geometrical compensation model to the object model data.

17. The system of claim 13, wherein the program code is executable by the processor to further:

validate the data set to determine if the deviations falls within an expected range.

18. The system of claim 13, wherein the apparatus-specific geometrical compensation model specifies a plurality of parameters that are each associated with a different location within a fabrication chamber of the specific additive manufacturing apparatus, each parameter comprising either or both of a scaling factor and an offset value.

19. The system of claim 13, further comprising the specific additive manufacturing apparatus, wherein the processor and the memory are part of a computing device separate from the specific additive manufacturing apparatus.

* * * * *